Aug. 5, 1969 E. F. KING 3,459,971
ADJUSTABLE PULSE GENERATING CIRCUIT INCLUDING PULSE SHAPING MEANS TO DECREASE PULSE RISE AND DECAY TIMES
Filed March 22, 1967
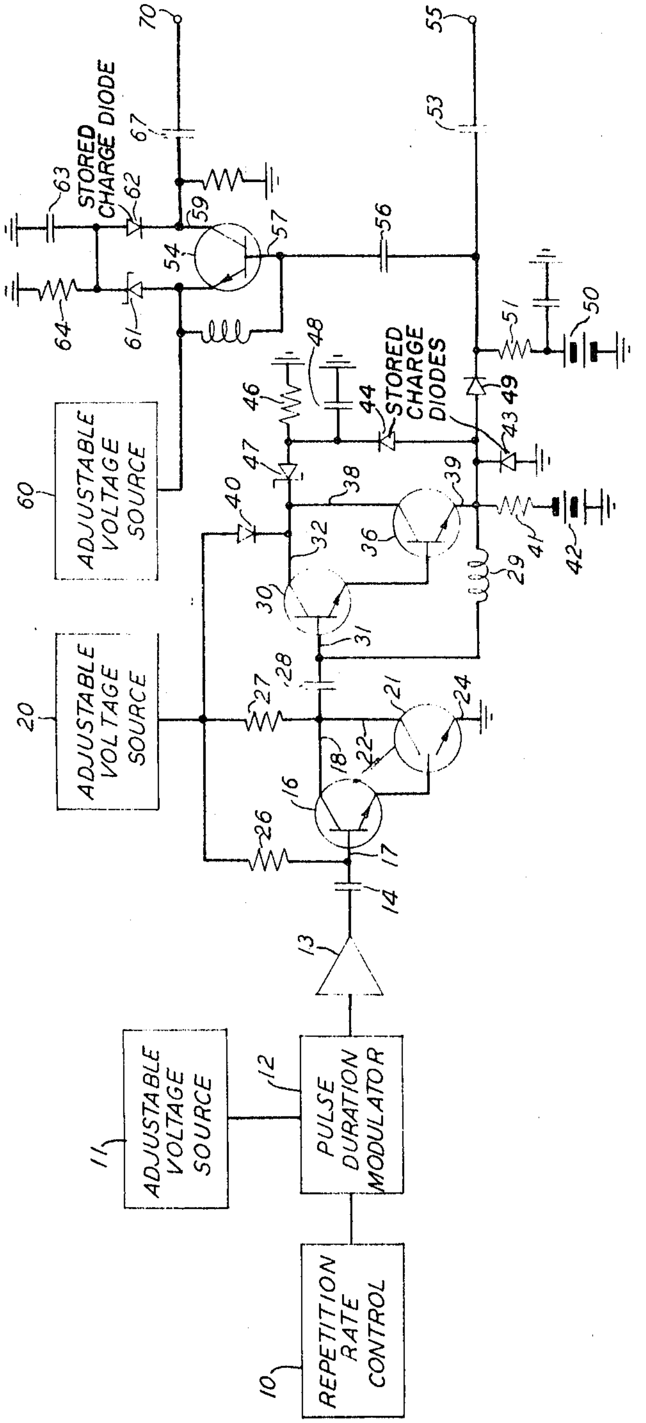
INVENTOR
E. F. KING
BY Alfred G. Steinmetz
ATTORNEY

United States Patent Office 3,459,971
Patented Aug. 5, 1969

3,459,971

ADJUSTABLE PULSE GENERATING CIRCUIT INCLUDING PULSE SHAPING MEANS TO DECREASE PULSE RISE AND DECAY TIMES

Ernam F. King, Allentown, Pa., assignor to Bell Telephone Laboratories, Incorporated, Murray Hill and Berkeley Heights, N.J., a corporation of New York Filed Mar. 22, 1967, Ser. No. 625,068
Int. Cl. H03k *5/02, 5/04*
U.S. Cl. 307—268 7 Claims

ABSTRACT OF THE DISCLOSURE

A pulse generator, which permits the independent adjustment of pulse parameters including the pulse duration, repetition rate and amplitude, has pulse shaping circuitry utilizing stored charge diodes to reduce the pulse rise and decay time. The stored charge diode, used to reduce the pulse decay time, is clamped to a potential level differing from the adjustable potential level of the energizing source of the pulse shaping circuit by a fixed amount. This prevents attenuation of the pulse output and readily permits the adjustment of the pulse amplitude through adjustment of the energizing potential.

FIELD OF THE INVENTION

This invention relates to pulse generating circuits permitting the independent adjustment of pulse parameters and, more particularly, to such a pulse generating circuit including pulse shaping circuitry to reduce the pulse rise and decay times.

BACKGROUND OF THE INVENTION

In many testing situations requiring the use of pulse signals, it is desirable to have a pulse generator capable of generating pulses with adjustable pulse parameters. Such a pulse generator is useful in the testing of semiconductor devices where a single pulse generator is used to test devices having widely varying characteristics. The accurate determination of the switching response of high speed switching transistors, for example, requires the generation of pulses having extremely rapid rise and decay times with the pulse amplitude and duration adjusted to suitably match the characteristics of a particular transistor. For applications such as this, the pulse generator must provide for independent variation of individual pulse parameters without degrading the pulse rise and decay times.
bias a first stored charge diode containing a stored charge.

An effective method of generating pulses with rapid rise times is to utilize the transient reverse current characteristic of a stored charge diode to produce a sudden voltage transition causing a rapid pulse rise time. The use of this method, however, to reduce both the rise and decay times of a pulse with adjustable parameters has been unsatisfactory because the addition of an oppositely poled stored charge diode to reduce the pulse decay time sharply attenuates the amplitude of the pulse.

A pulse shaping circuit utilizing the transient reverse current characteristic of a plurality of stored charge diodes to reduce both the pulse rise and decay times is disclosed in Patent 3,200,267, issued Aug. 10, 1965, to J. S. Cubert. However, in the circuit disclosed therein the duration of the generated pulse is directly dependent upon the recovery time characteristics of the stored charge diodes used to reduce the pulse decay time, and hence the pulse duration is not readily adjustable.

It is therefore an object of the invention to generate pulses with adjustable amplitudes having rapid pulse rise and decay times without attenuating the amplitude or limiting the adjustable duration of the pulses.

SUMMARY OF THE INVENTION

A pulse generator in accordance with the present invention includes a pulse repetition rate control circuit to control the pulse repetition rate and an adjustable pulse duration modulator to control the pulse duration. The pulse output of the pulse duration modulator is applied to a pulse shaping circuit, which uses stored charge diodes to decrease the pulse rise and decay times. The rapid pulse rise time is produced by utilizing the pulse output to reverse bias a first stored charge diode containing a stored charge. The exhaustion of the stored charge of the first stored charge diode produces a rapid pulse rise time. The rapid pulse decay time is produced by utilizing the current generated by the pulse output to store charge in a second stored charge diode poled in a direction opposite to that of the first stored charge diode. This second stored charge diode is clamped to a potential which differs from that of the pulse shaping circuit energizing source by a preselected fixed amount. The potential of the energizing source is adjustable to permit, in turn, adjustment of the pulse amplitude. At the termination of the pulse, the second stored charge diode is reverse biased. The stored charge of the second stored charge diode maintains the pulse amplitude until it is exhausted. Upon the exhaustion of the stored charge, the output lead of the pulse shaping circuit is rapidly isolated from the clamping potential producing therefrom a very rapid pulse decay time. By thus clamping the second stored charge diode to a potential determined by the adjustable potential of the energizing source, the pulse amplitude is easily adjustable and the charge storage current of the second stored charge diode does not attenuate the selected pulse amplitude.

A feature of the pulse generator of the invention is the provision of means for individually adjusting the pulse amplitude, duration, and repetition rate independently of each other. Each of the aforementioned pulse parameters is controlled by varying the individual energizing source potentials as respectively applied to the pulse shaping circuit, the pulse duration modulator and the repetition rate control circuit.

BRIEF DESCRIPTION OF THE DRAWING

These and other objects and features of the invention will appear more clearly upon consideration of the following detailed description of an illustrative embodiment of the invention taken in conjunction with the accompanying drawing, The sole figure is a schematic diagram partially in block form depicting one illustrative embodiment of applicant's invention arranged to generate pulses with rapid rise and decay times including apparatus to independently adjust the pulse amplitude, repetition rate, and duration.

DETAILED DESCRIPTION

As is typical in prior art pulse generators, pulses are initially generated by an oscillator of some form and adjusted in length by circuitry, the response of which to an applied pulse may be varied by an appropriate control signal, as for example by a variable direct-current potential. Thus, as shown in the drawing, a repetition rate control circuit 10 applies triggering pulse signals at a preselected repetition rate to a pulse duration modulator 12. The repetition rate control circuit 10 may comprise a relaxation type oscillator with an adjustable time constant or any similiar circuit capable of generating triggering pulse signals at adjustable preselected repetition rates.

The pulse duration modulator 12 in response to each applied triggering pulse generates a pulse having some preselected duration. The generated pulse duration is controlled by the energizing potential level applied to the pulse duration modulator 12 from the adjustable voltage source 1. The pulse duration madulator 12 may comprise, for instance, a triggered relaxation type circuit. The pulse duration is dependent upon the recharging time of an energy storage device discharged in response to the applied triggering pulse. Such circuits are well known in the art and need not be discussed in detail.

The pulse output of the pulse duration modulator 12 is applied, via an isolation amplifier 13 and a coupling capacitor 14, to the base 17 of the transistor 16. In the present disclosed embodiment this pulse is chosen to have a negative polarity; however, it is to be understood that the signal and device polarities described herein may be changed without departing from the spirit and scope of the invention.

The transistor 16 is connected in a Darlington type compound connection with the transistor 21. An adjustable voltage source 20 provides a positive voltage, via a resistor 26, to the base 17 of transistor 16 to bias the transistors 16 and 21 into a conducting condition. The collectors 18 and 22 are connected, via the coupling capacitor 28, to the base 31 of the transistor 30. The compound connected transistors 30 and 36 are normally in a nonconducting condition due to the inductor coil 29 which holds the base 31 and the emitter 39 to the same D.C. voltage level. The natural response of the inductor coil 29 to the rapid pulse signals applied to the base 31 maintains the high input impedance of the two transistors 30 and 36.

The negative pulse output of the isolation amplifier 13, in response to the pulse output of the pulse duration modulator 12, biases the transistors 16 and 21 into a nonconducting condition. The common potential of the collectors 18 and 22, in response thereto, increases to a potential level approximating the potential of the adjustable voltage source 20. Hence the positive potential of the adjustable voltage source 20 is applied, via the resistor 27 and the coupling capacitor 28, to the base 31 and temporarily drives the transistors 30 and 36 into a conducting condition for the pulse duration. The capacitance of capacitor 28 is sufficiently large to transmit the positive potential for the pulse duration. The impedance of the resistor 27 is at least an order of magnitude less than the input impedance of the compound connected transistors 30 and 36. This high input impedance produces a high potential level signal output at the emitter 39, inasmuch as the potential of the base 31 is nearly that of the adjustable voltage source 20.

The transistors 30 and 36, as described above, are normally in a nonconducting condition. Under this condition, the negative potential source 42 forward biases the stored charge diode 43. Hence a charge storing current flows through the stored charge diode 43. The resistor 41 limits the magnitude of this charge storing current.

The transistors 30 and 36 in response to the negative pulse output of the isolation amplifier 13, as described above, are subsequently biased into a conducting condition. The stored charge diode 43 is reverse biased by the positive potential appearing at the emitter 39. The stored charge diode 43, in response thereto, initially continues to conduct a current and therefore temporarily functions as a short circuit connection to ground. When the stored charge is exhausted, the stored charge diode 43 makes a sharp transition to a nonconducting state. The stored charge diode 43 in this state creates an open circuit between ground and the emitter 39. The magnitude of the resistor 41 is large with respect to the output impedance of transistor 36, and hence the potential of the emitter 39 rises very rapidly to a positive potential. In this manner a rapid pulse rise time is generated.

The transistors 30 and 36, as described hereinabove, are normally in a nonconducting condition. The cathode of a stored charge diode 44 is connected to the anode of a Zener diode 47, the cathode of which is, in turn, coupled via the diode 40 to the adjustable voltage source 20. The cathode of the stored charge diode 44 is thus clamped to a fixed potential level below the potential level of the adjustable voltage source 20. The voltage drop across the stored charge diode 44 is thus normally in a reverse direction and there is no forward current in the diode. The aforementioned positive potential at the emitter 39 with the transistors 30 and 36 in a conducting condition is clamped to the fixed potential level at the cathode of the stored charge diode 44. As the positive potential at the emitter 39 attempts to increase to the level of the adjustable voltage source 20, the stored charge diode 44 is forward biased and charge storing current flows through it to ground, via the capacitor 48. This forward current through the stored charge diode 44 causes a charge to be stored therein. The stored charge diode 44 additionally clips the level of the positive pulse output, at emitter 39, to a potential level which is less than the potential of the adjustable voltage source 20 by an amount substantially equal to the potential drop across Zener diode 47 and the diode 40.

The resistor 46 and the capacitor 48 also interconnect the cathode of the stored charge diode 44 to ground and hence provide a path to ground for the charge storage current. The RC time constant of the capacitor 48 and the resistor 46 exceeds by at least an order of magnitude the duration of the positive pulse generated at the emitter 39.

Upon the termination of the pulse, the stored charge diode 44 does not initially return to its normally reverse biased steady state condition. The stored charge of the stored charge diode 44 temporarily maintains the pulse at its full amplitude until the stored charge is exhausted. At the exhaustion of the stored charge, the stored charge diode 44 makes a sharp transition to its nonconducting condition and the pulse amplitude decays very rapidly. In this fashion the rapid pulse decay time is generated.

The pulse output with its reshaped leading and trailing edges is applied to a diode 49 which in the absence of pulses is normally reverse biased by the positive potential source 50 connected by way of resistor 51 to its cathode. The reverse bias is limited to a small positive potential. This reverse bias is overcome by a small positive potential applied to the anode of diode 49. The diode 49 is biased sufficiently to clip off approximately one volt of the initial rise portion of the leading edge of the pulse output. The clipping action of the diode 49 therefore eliminates an irregularity in the initial rise portion of the pulse caused by an impedance effect due to the stored charge diode 43.

The shaped output pulse is applied, via the coupling capacitor 53, to the output terminal 55 of the pulse generator. The output terminal 55 may be connected to a switching transistor whose characteristics response to positive pulses is to be tested or some other device to be tested.

The pulse output of the diode 49 is also applied, via a coupling capacitor 56, to the base 57 of the transistor 54. The transistor 54 is driven by the applied pulse into a conducting condition for the duration of the pulse. The transistor 54 in its conducting condition enables the application of the negative potential of the adjustable voltage source 60, via its collector-emitter path and the coupling capacitor 67, to the output terminal 70 where it may be utilized for testing purposes.

The rapid pulse rise time is achieved without using a stored charge diode due to the rapid response characteristics of the transistor 54. This rapid response characteristic allows the positive pulse applied to the base 57 to very rapidly drive the transistor 54 into a highly conducting condition. This rapid transition produces a rapid pulse rise time.

A stored charge diode 62 is connected to the collector 59 of the transistor 54 to reduce the pulse decay time. The opposite terminal of the stored charge diode 62 is connected to a Zener diode 61 which, in turn, is connected to the adjustable voltage source 60. The voltage drop in the Zener diode clamps the potential of the aforementioned opposite terminal to a fixed potential level above the output of the adjustable voltage source 60. The resistor 64 limits current flow in the Zener diode 61.

A current path to ground for the charge storage current of the stored charge diode 62 is similarly provided for by the capacitor 63. The capacitor 63 and the resistor 64 in combination have an RC time constant which is at least an order of magnitude greater than the time duration of the pulse output on the output terminal 70.

The stored charge diode 62 reduces the negative pulse decay time in exactly the same manner as is described above in the case of the positive pulse and need not be described in detail.

As described above the pulse rise and decay time of both positive and negative pulses is significantly reduced through the utilization of stored charge diodes. The reduction of the pulse decay time is furthermore achieved without attenuating or limiting the adjustable amplitude of the pulses, by clamping the stored charge diodes to a fixed potential level below the variable potential energizing source of each pulse shaping circuit. The pulse amplitude of either the positive or the negative pulses may thus be independently varied.

While the above invention is described with respect to one specific illustrative embodiment, many variations of the invention will suggest themselves to those skilled in the art without departing from the spirit and scope of the invention.

What is claimed is:

1. In combination, a pulse amplifying device including an input terminal to receive pulse signals and an output terminal, an adjustable source of energizing potential connected to the pulse amplifying device, a Zener diode having one terminal connected to the energizing potential and poled to derive a constant voltage drop therefrom, and a stored charge diode interconnecting said output terminal and the other terminal of the Zener diode and poled to conduct charge storing current in response to the pulse output of the pulse amplifying device whereby the stored charge in the stored charge diode, when it is reverse biased, temporarily maintains the pulse amplitude at the trailing edge of the pulse and at the exhaustion of the stored charge rapidly switches the potential level of the output terminal to generate a rapid pulse decay time.

2. The combination as defined in claim 1 further including a source of reference potential, means to facilitate current flow through the stored charge diode during the pulse output of the pulse amplifying device, said means comprising an impedance means and a capacitance means connected in parallel and interconnecting the junction of the Zener diode and the stored charge diode to said reference potential and the respective magnitude of the capacitance means and the impedance means having a time constant of at least an order of magnitude greater than the time duration of the pulse signal at the output terminal.

3. The combination as defined in claim 1 further including a source of reference potential, an additional stored charge diode interconnecting the output terminal to said reference potential and poled so as to be reverse biased in response to the pulse output of the pulse amplifying device and means to supply charge storing current to the additional stored charge diode whereby the additional stored charge diode temporarily attenuates the pulse at the leading edge of the pulse until the exhaustion of the stored charge whereupon it rapidly switches the potential of the output terminal to the potential of the pulse signal output to generate a rapid pulse rise time.

4. The combination as defined in claim 1 further including a second pulse amplifying device, having input and output terminals, a connecting lead joining the output terminal of the first pulse amplifying device to the input terminal of the second pulse amplifying device, a second adjustable source of energizing potential having a polarity opposite to said adjustable source of energizing potential and connected to the second pulse amplifying device, a second Zener diode connected to the second adjustable source of energizing potential and poled to derive a constant voltage drop therefrom, a second stored charge diode interconnecting the output terminal of said second amplifying device and the second Zener diode and poled to conduct charge storing current in response to the pulse output of the second pulse amplifying device whereby the stored charge in the second stored charge diode temporarily maintains the pulse amplitude at the trailing edge of the pulse output of the second pulse amplifying device and at the exhaustion of the stored charge rapidly switches the potential level of the second output terminal to generate a rapid pulse decay time, and means to facilitate current flow through the second stored charge diode during the pulse output of the second pulse amplifying device.

5. A pulse shaping circuit comprising a source of reference potential, a pulse amplifying device including an output terminal, an adjustable source of energizing potential connected to said pulse amplifying device, a voltage divider interconnecting said source of energizing potential to said reference potential, said voltage divider comprising a Zener diode coupled to said energizing source and poled so as to generate a constant voltage drop therefrom, and an impedance means interconnecting said Zener diode to said reference potential, a stored charge diode interconnecting said output terminal to the junction of said Zener diode and said impedance means and poled in a direction to conduct charge storing current in response to the pulse output of said pulse amplifying device, and a capacitive current path interconnecting said junction to said reference potential, the capacitance of said path in combination with the impedance magnitude of said means having a time constant of at least an order of magnitude greater than the duration of the pulse waveform transmitted by said amplifying device.

6. A pulse shaping circuit as defined in claim 5 further including an additional stored charge diode connected to said output terminal and poled so as to be reverse biased during the pulse output and means to supply charge storing current to said additional stored charge diode between the pulse outputs of said pulse amplifying device.

7. A pulse shaping circuit as defined in claim 6 further including a first diode included in the path of said output terminal and poled to transmit the output pulse of said pulse amplifying device, means to bias said first diode so as to clip off the initial rise portion of the pulse output of said pulse amplifying device and a second device inserted between said Zener diode and said adjustable source of energizing potential and poled to apply the energizing potential to Zener diode.

References Cited

UNITED STATES PATENTS

| | | | |
|---|---|---|---|
| 3,132,259 | 5/1964 | Magleby | 307—281 XR |
| 3,168,654 | 2/1965 | Lewis | 307—281 XR |
| 3,191,062 | 6/1965 | Forge | 307—319 |
| 3,292,006 | 12/1966 | Candy et al. | 307—319 XR |

ARTHUR GAUSS, Primary Examiner

JOHN ZAZWORSKY, Assistant Examiner

U.S. Cl. X.R.

307—264, 265, 281, 319